United States Patent
Baisl

(10) Patent No.: US 8,629,603 B2
(45) Date of Patent: Jan. 14, 2014

(54) ORGANIC LIGHT-EMITTING DEVICE WITH HOMOGENEOUS TEMPERATURE DISTRIBUTION

(75) Inventor: Richard Baisl, Regensburg (DE)

(73) Assignee: OSRAM Opto Semiconductors GmbH, Regensburg (DE)

( * ) Notice: Subject to any disclaimer, the term of this patent is extended or adjusted under 35 U.S.C. 154(b) by 0 days.

(21) Appl. No.: 13/517,015

(22) PCT Filed: Dec. 9, 2010

(86) PCT No.: PCT/EP2010/069245
§ 371 (c)(1), (2), (4) Date: Jun. 18, 2012

(87) PCT Pub. No.: WO2011/073077
PCT Pub. Date: Jun. 23, 2011

(65) Prior Publication Data
US 2012/0256528 A1     Oct. 11, 2012

(30) Foreign Application Priority Data
Dec. 16, 2009  (DE) .......................... 10 2009 054 742

(51) Int. Cl.
| | | |
|---|---|---|
| H01J 1/02 | (2006.01) | |
| H01J 7/24 | (2006.01) | |
| H01J 61/52 | (2006.01) | |
| H01K 1/58 | (2006.01) | |

(52) U.S. Cl.
USPC ............................................. 313/46; 313/504

(58) Field of Classification Search
USPC ............... 313/46, 504, 503; 428/690
See application file for complete search history.

(56) References Cited

U.S. PATENT DOCUMENTS

| 8,339,033 B2 * | 12/2012 | Yoshioka et al. ............. 313/503 |
|---|---|---|
| 2004/0012331 A1 | 1/2004 | Yamazaki et al. |
| 2006/0022589 A1 | 2/2006 | Cok |
| 2006/0091791 A1 * | 5/2006 | Shin ............................. 313/503 |
| 2006/0152147 A1 * | 7/2006 | Lee et al. ...................... 313/504 |
| 2006/0207649 A1 | 9/2006 | Nabeta |
| 2006/0228543 A1 * | 10/2006 | Lu et al. ........................ 428/323 |
| 2007/0194694 A1 * | 8/2007 | Reddy ........................... 313/503 |
| 2008/0030127 A1 | 2/2008 | Tsou et al. |
| 2009/0087639 A1 | 4/2009 | Li et al. |
| 2009/0087640 A1 * | 4/2009 | Li et al. ...................... 428/304.4 |

FOREIGN PATENT DOCUMENTS

EP     1 519 217     3/2005

OTHER PUBLICATIONS

S. Berber et al., "Unusually High Thermal Conductivity of Carbon Nanotubes", Physical Review Letters, vol. 84, No. 20, The American Physical Society, pp. 4613-4616.

* cited by examiner

Primary Examiner — Mariceli Santiago
Assistant Examiner — Glenn Zimmerman
(74) Attorney, Agent, or Firm — Cozen O'Connor

(57) ABSTRACT

An organic light-emitting device (100) comprising: an active layer for producing electroluminescent radiation and decoupling the electroluminescent radiation; and a thermally-conducting layer (206) located in a decoupling path of the electroluminescent radiation for dissipating heat generated during an electroluminescence process; wherein the thermally-conducting layer (206) has a thermal conductivity of more than 200 W/mK, in particular more than 500 W/mK.

13 Claims, 4 Drawing Sheets

ORGANIC LIGHT-EMITTING DEVICE WITH HOMOGENEOUS TEMPERATURE DISTRIBUTION

RELATED APPLICATIONS

This is a U.S. National Phase under 35 USC §371 of International Application No. PCT/EP2010/069245, filed on Dec. 9, 2010, and claims priority on Germany Application No. 10 2009 054 742.8, filed on Dec. 16, 2009, the entire content of which is hereby incorporated by reference.

FIELD OF THE INVENTION

The present invention relates to an organic light-emitting device.

BACKGROUND OF THE INVENTION

An organic light-emitting device (OLED) is a luminescence emitter by means of which electromagnetic radiation is produced from electric energy. The OLED has at least one organic active layer in which the electromagnetic radiation is produced. The active layer is arranged between an anode and a cathode. When a forward potential is applied, the anode injects holes into the active layer while the cathode injects electrons. The injected holes and electrons each drift (under the influence of an externally applied electric field) to the oppositely charged electrode and produce an electroluminescent emission on being recombined in the active layer.

A particular advantage of an OLED is that it can be used as a large-area and homogeneous light source. That allows totally novel applications as an illuminant. Commercially available OLEDs such as "ORBEUS CDW-031", a product offered by the applicant, currently still have a relatively low light yield. The aim, though, is for substantially higher yields and luminance densities to be achieved in the future. However, a problem associated with size and higher luminance densities is that the OLED heats up inside. That gives rise to thermal effects such as, for example, ageing of the different functional layers. Temperature distribution not being homogeneous across a large-area component, the result can be different local ageing processes within the layers which, when the component is operated for longer periods, will give rise to increased inhomogeneities in luminance density. Inhomogeneities of such kind are, though, undesired.

SUMMARY OF THE INVENTION

One object of the present invention is to provide an organic light-emitting device in the case of which inhomogeneous temperature distribution is as far as possible prevented.

Different embodiment variants of the organic light-emitting device have an active layer for producing electroluminescent radiation and a thermally-conducting layer for dissipating heat that is generated during an electroluminescence process. The thermally-conducting layer has a thermal conductivity of more than 200 W/mK, in particular more than 500 W/mK.

The basic idea common to all the various embodiment variants is that a thermally-conducting layer for dissipating or, as the case may be, distributing heat is incorporated in the organic light-emitting device. The thermally-conducting layer has particularly good thermal conductivity. It is greater than the thermal conductivity of metals used in the organic light-emitting device. The conductivity of, for instance, aluminum is 200 W/mK. Carbon-based materials are in particular used as a thermally-conducting material. They can be in the form of, for example, carbon nano tubes: CNT). As a material, CNTs are particularly good thermal conductors so that heat generated in the device can be effectively transported to the outside. The electrical properties of CNTs which enable them to be used as a semiconductor or electrical conductor moreover allow them to be used in a particularly versatile manner in the organic light-emitting device's various materials. Finally, CNTs' optical properties make them suitable for only slightly affecting the device's luminance characteristics. Other materials, for example a thin thermally-conducting foil containing graphite, can be used if optical properties are not especially significant. The thermally-conducting foil can also contain metals in order to achieve a high thermal conductivity.

The thermally-conducting layer is in various embodiment variants in direct contact with the active layer. The thermally-conducting layer can in this connection be in direct mechanical or, as the case may be, physical contact with the active layer. For example it can have been applied to the active layer. Heat produced in the active layer can thereby be ducted particularly efficiently from the active layer into other regions of the organic light-emitting device. Heat distribution in the active layer will furthermore be homogenized particularly efficiently. For example ageing processes in the active layer will consequently be homogenous in nature so that the organic light-emitting device's luminance characteristics will remain substantially homogeneous even when the the active layer undergoes ageing.

The thermally-conducting layer (206) is in various embodiment variants located in a radiation-decoupling path of the electroluminescent radiation. The thermally-conducting layer therein preferably exhibits a sufficiently high degree of transparency for the electroluminescent radiation. Thus thermal homogenizing will be achieved specifically in a region in which the organic light-emitting device's luminance characteristics are produced or, as the case may be, substantially influenced.

In many embodiment variants the thermally-conducting layer extends to an outer side of the device in order to dissipate the heat particularly well. In other embodiment variants the thermally-conducting layer is coupled to a heat sink, for example a cooling body. The heat is in some embodiment variants only distributed evenly inside the device to achieve even, which is to say homogeneous temperature distribution.

The thermally-conducting layer therein has in some embodiment variants a multiplicity of separate partial regions. Said partial regions can be at any suitable locations inside the organic light-emitting device. It will thus be possible to obtain desired temperature distribution while the device is under a thermal load.

In some embodiment variants the organic light-emitting device has an anode layer and the thermally-conducting layer is provided as an intermediate layer in the anode layer. That is particularly advantageous because the anode side frequently has a transparent metal oxide as layer material. Transparent metal oxides often have low thermal conductivity which is improved by the intermediate layer.

In some embodiments of said variants the thermally-conducting layer is therein provided as a multiplicity of intermediate layers in the anode layer.

In some embodiment variants the organic light-emitting device has an organic functional layer having the active layer. The thermally-conducting layer is provided as an intermediate layer in the organic functional layer. Said embodiment variants are particularly advantageous because heat is thereby dissipated from the organic light-emitting device's regions in which heat is frequently generated. Electromagnetic radiation is generated in the active layer by electroluminscence. That takes place through the recombination of electron-hole pairs (excitons) and their relaxation. Relaxation can, though, take place also by way of processes other than the emission of electromagnetic radiation, for example through quenching, during which heat is produced. However, even though undesired, those effects can never be totally suppressed. As regards heat dissipation, what is furthermore achieved by the thermally-conducting layer in the organic functional layer is that specifically the sensitive organic materials can be cooled particularly well by the structure of the cited embodiment variants; what, though, is at least achieved by the thermally-conducting layer is even distribution of the thermal energy and hence even thermal loading of the organic functional layer.

In some embodiments of said variants the thermally-conducting layer is provided as a multiplicity of intermediate layers in the organic functional layer.

In some embodiment variants the organic light-emitting device has a cathode layer that is covered by the thermally-conducting layer. That structure makes particularly good and hence also effective thermal decoupling possible since frequently no radiation is decoupled via the cathode layer. That applies all the more when the cathode layer has a metal, a metal alloy, or metal layers and hence likewise relatively good thermal conductors.

In some embodiment variants the thermally-conducting layer is located between the anode layer and organic functional layer. The thermally-conducting layer can hence be provided in the organic light-emitting device with no major modifications to existing production processes. That arrangement furthermore offers the advantage that heat dissipating will be improved specifically at a location where very poor temperature equalizing otherwise takes place. In some embodiments the thermally-conducting layer extends in the form of separate strips on a boundary area between the anode layer and organic functional layer so that optical decoupling via the anode side will be affected as little as possible. In some embodiments the thermally-conducting layer extends like a network on the boundary area between the anode layer and organic functional layer.

DETAILED DESCRIPTION OF THE DRAWINGS

Various exemplary embodiments of the organic light-emitting device are explained in more detail below with the aid of the drawings. In the figures, the first digit(s) of a reference numeral indicate the figure in which the reference numeral is first used. The same reference numerals are used in all the figures for elements or, as the case may be, properties that are the same kind or have the same effect.

What is shown is as follows.

DETAILED DESCRIPTION OF THE DRAWINGS

Figure 1:
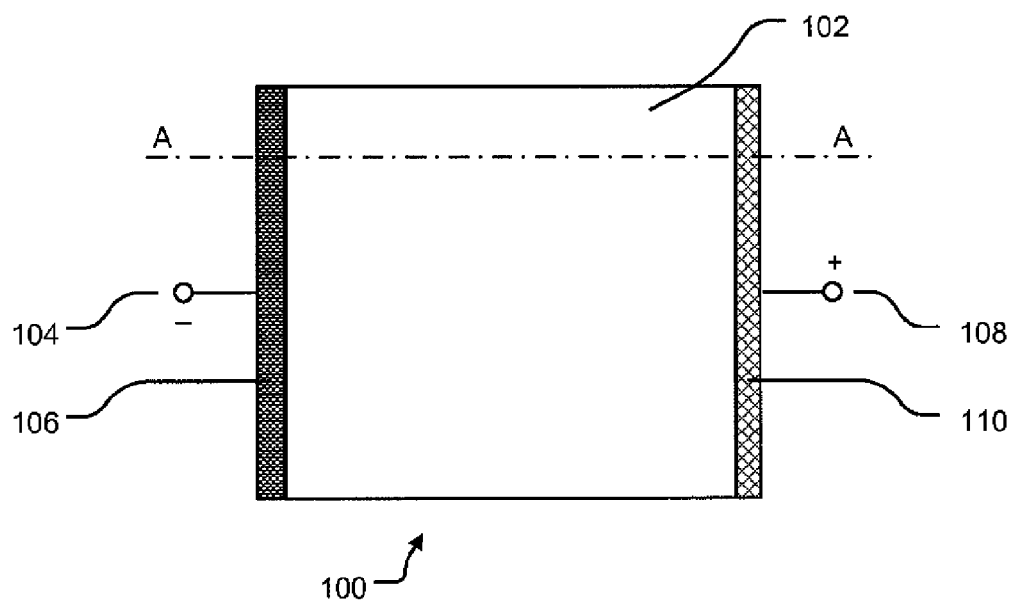
FIG. 1 is a view onto an organic light-emitting device.

FIG. 1 is a view onto an organic light-emitting device. Organic light-emitting device 100 is an electroluminescent device. It has a first top side that has been applied to a cathode layer 102. Cathode layer 102 is connected to a cathode terminal 104. The connection is via a first electrode 106 which is part of the cathode in the organic light-emitting device 100 shown. An anode of the organic light-emitting device 100 is connected to an anode terminal 108 and has a second electrode 110. Second electrode 110 directly borders an anode layer which covers the surface—opposite cathode layer 102—of organic light-emitting device 100. The anode layer cannot be seen in FIG. 1.

Cathode layer 102 and the anode layer serve as an electrical supply line for feeding charge carriers to an organic functional layer located between the cathode and anode. Both supply lines can include metals, for example Ag or, as the case may be, metallic compounds. Particularly metals having a high reflection coefficient are therein suitable for preventing absorption within the organic functional layer. At least one of the electrical supply lines is embodied as a transparent supply line to enable the electromagnetic radiation produced inside the organic functional layer to be decoupled to the outside. It is also conceivable for both supply lines to be embodied as a transparent supply line for providing a totally transparent organic light-emitting device. A transparent supply line can have a transparent, conductive oxide (TCO). The TCO is as a rule a metal oxide, for example zinc oxide, tin oxide, cadmium oxide, titanium oxide, indium oxide, or indium tin oxide (ITO). Alongside binary metal-oxygen compounds, counted among which are also $SnO_2$ and $In_2O_3$, ternary metal-oxygen compounds such as, for example, $Zn_2SnO_4$, $CdSnO_3$, $ZnSnO_3$, $MgIn_2O_4$, $GaInO_3$, $Zn_2In_2O_5$, and $In_4Sn_3O_{12}$, as well as mixtures of different transparent conductive oxides also belong to the TCO group. Furthermore, the TCOs do not necessarily have to correspond to a stoichiometric compound and can also be p- or n-doped to achieve high conductivity. The electrical supply lines can include highly conductive organic materials such as polyethylenedioxythiophene ("PEDOT") or doped organic layers. In connection with organic conductive layers the term "doping" can stand for a partial oxidation or, as the case may be, reduction of the organic layer. It is possible for all the cited materials to be present in an electrical supply line suitably mutually combined.

The structure of organic light-emitting device 100 is described for four exemplary embodiments in more detail below with the aid of cross-sections along an intersection axis A-A. For a simpler presentation, mutually opposite first electrode 106 and second electrode 110 are therein considered to be part of cathode terminal 104 and anode terminal 108 respectively.

First Exemplary Embodiment

Figure 2:
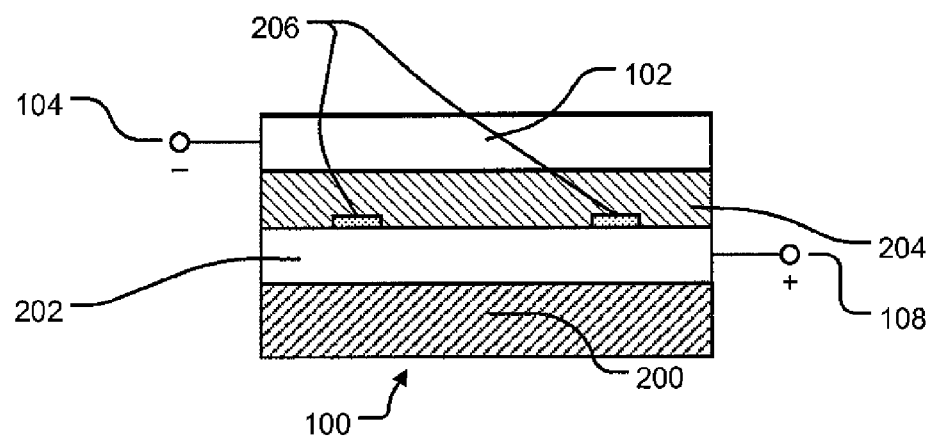
FIG. 2 shows a cross-section through a first exemplary embodiment along an intersection axis A-A.

FIG. 2 shows a cross-section through a first exemplary embodiment along an intersection axis A-A. Organic light-emitting device 100 has a substrate 200 to which a layer sequence has been applied. The substrate 200 is typically a transparent carrier made of glass for instance, or a foil such as, for example, a flexible plastic foil. An anode layer 202 has been applied to substrate 200. Anode layer 202 is transparent. Anode layer 202 accordingly includes a suitable transparent conductive material such as, for example, a TCO, possibly ITO. An organic functional layer 204 has been applied to anode layer 202. A cathode layer 102 has been applied over organic functional layer 202. The layer sequence shown is usually covered by an encapsulation which, for a simpler presentation, will not be considered at all in the description and so has been omitted.

Organic functional layer 204 has one or a more organic layer(s). At least one active layer is provided in which an emitted radiation is produced as soon as an electric voltage has been applied to it. The active layer has an electroluminescent material. For example the electroluminescent material can have suitable polymers for a fluorescence or phosphorescence emission. Small organic molecules that emit by way of fluorescence or photofluorescence can alternatively serve as an active layer (organic electroluminescence layer).

When a forward potential is being applied, the anode injects holes into anode layer 202 while the cathode injects electrons into cathode layer 102. The injected holes and electrons each drift (under the influence of an externally applied electric field) to the oppositely charged electrode and produce an electroluminescent emission on being recombined in the active layer.

The charge carriers can in each case be supplied via a charge transport layer. The charge transport layer located between anode layer 202 and the active layer is referred to also as a hole transport layer (HTL). It can have, for example, a p-doped conductive organic or inorganic material. The charge transport layer located between cathode layer 102 and the active layer is referred to also as an electron transport layer (ETL). It can have, for example, an n-doped conductive organic or inorganic material. Suitable intrinsic, which is to say non-doped, layers can also be used for both charge transport layers. The charge transport layers are likewise part of the organic functional layer.

Cathode layer 102 is connected to a first terminal 104 to enable an electric voltage to be applied to organic functional layer 204 or, as the case may be, the active layer. Anode layer 202 is connected to a second electric terminal 108. First terminal 104 and second terminal 108 can be connected to an energy source not shown in the figure. For example they are coupled to a constant power source, for example a battery or a driver circuit.

Figure 3:
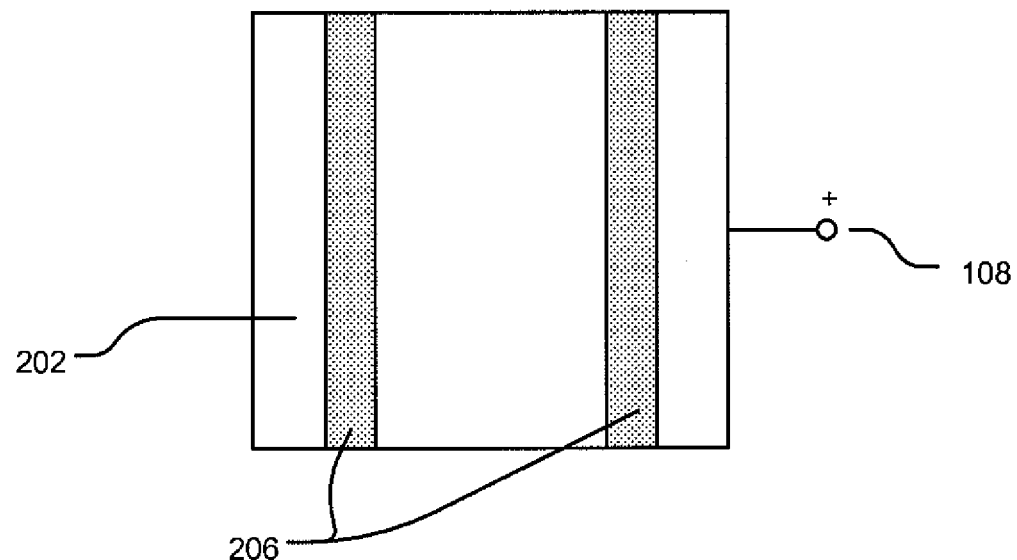
FIG. 3 is a view onto the anode layer of the first exemplary embodiment.

Heat is produced inside organic light-emitting device 100 when charge carriers are recombined in the active layer and through ohmic resistances in the electrical supply lines. That is particularly disadvantageous for the materials in organic functional layer 204. The materials employed there are usually organic molecules or organic macromolecules (polymers). These materials can degrade owing to temperature effects; in particular, processes such as dissociation may occur. The organic materials employed in producing an OLED can undergo temperature-induced changes in both their molecular and material structure (for example owing to [re-]crystallizing, glass transitions, etc.) so that different optical properties in terms of, for example, emission spectra or refractive indices can be induced. A heat-dissipating layer 206 for dissipating heat is provided in the first exemplary embodiment. It has a plurality of partial regions extending in the form of conductor strips laterally between anode layer 202 and organic functional layer 204. Thermally-conducting layer 206 is thus arranged analogously to what are termed busbars between anode layer 202 and organic functional layer 204. That arrangement becomes clear particularly in connection with FIG. 3. FIG. 3 is a view onto anode layer 202 in the first exemplary embodiment.

Heat-dissipating layer 206 has a thermally-conducting material that combines two essential properties. On the one hand the material has a high thermal conductivity; a thermal conductivity of at least 500 W/mK should therein be provided for a thermally-conducting layer 206 located in the body of the OLED. On the other hand, the material is at least partially transparent for the emitted radiation so that it will affect the luminance characteristics of organic light-emitting device 100 as little as possible. CNTs are a particularly well suited material for that. They generally have a very high thermal conductivity. It is at least an order of magnitude (factor 10) higher than in the case of metals. Add to this the fact that both the transparent metal oxides frequently used on the anode side and substrate 200 have an even lower thermal conductivity. Desired optical properties and/or a high electrical conductivity for the CNTs can furthermore be achieved by suitably selecting the structure of the CNTs. The CNTs can hence form a particularly good heat sink in organic light-emitting device 100 without substantially disrupting its actual function as an electroluminescent device.

Because thermally-conducting layer 206 has been applied only to partial regions of anode layer 202, in particular the luminance characteristics will be affected only slightly.

Particularly thin strips can thereby also be provided as partial regions of thermally-conducting layer 206. Heat dissipation between organic functional layer 204 and anode layer 202 can generally be optimized by selecting the size, number, and density of the partial regions.

It is, though, also possible for heat dissipation to be able to be influenced at other locations in the organic light-emitting device for appropriately establishing its temperature characteristics. The following exemplary embodiments are intended to help elucidate that.

Figure 4:
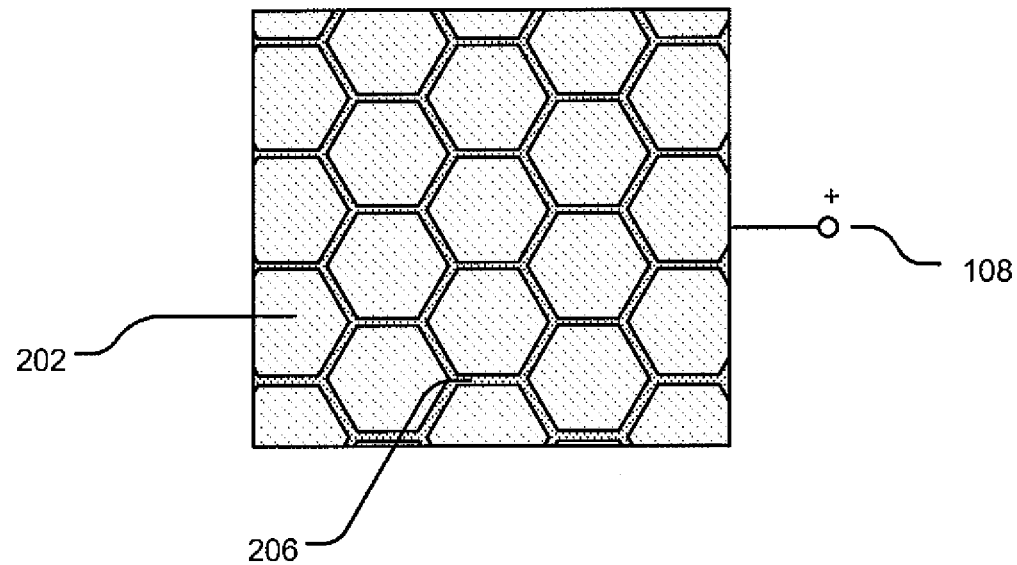
FIG. 4 is a view onto the anode layer of another embodiment of the first exemplary embodiment.

FIG. 4 is a view onto the anode layer of another embodiment of the first exemplary embodiment. Thermally-conducting layer 206 extends like a network on anode layer 202. Thermally-conducting layer 206 forms a hexagonal network so that as good as possible thermal coupling with simultaneous low coverage will be achieved. The organic light-emitting device's luminance characteristics will consequently be particularly little affected.

The thermally-conducting layer can in both embodiments be applied using techniques such as thermal vapor deposition or chemical vapor deposition (CVD) or by arc or laser means. Structuring can be achieved by means of masks or, as the case may be, lithography steps.

Second Exemplary Embodiment

Figure 5:
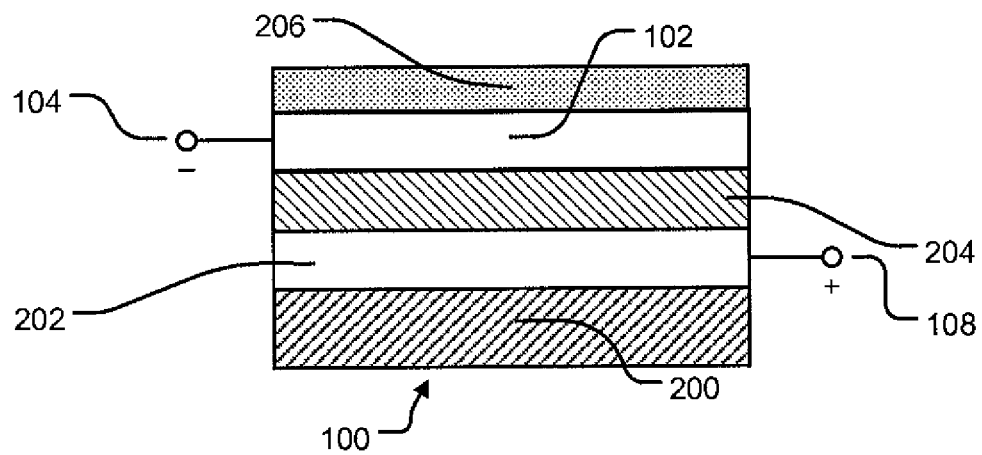
FIG. 5 shows a cross-section through a second exemplary embodiment along intersection axis A-A.

FIG. 5 shows a cross-section through a second exemplary embodiment along intersection axis A-A. The second exemplary embodiment differs from the first exemplary embodiment in that thermally-conducting layer 206 is not located between anode layer 202 and organic functional layer 204 but instead covers cathode layer 102 on the side facing away from organic functional layer 204. That will be possible particularly when no radiation is decoupled via cathode layer 102 because absorbing of the radiation in thermally-conducting layer 206 will consequently be of no significance. Cathode layer 102 will in that case advantageously have a reflecting material, for example gold or aluminum. Thermally-conducting layer 206 will ideally, as in the first exemplary embodiment, have carbon. The thermal conductivity should be higher than that of the material used in cathode layer 102. Owing to its high reflection coefficient, aluminum is frequently used for a non-transparent cathode layer. Thermally-conducting layer 206 should therefore have a coefficient of thermal conductivity of more than 200 W/mK. It can consist of a thermally-conducting foil, for example a thin graphite foil, applied to cathode layer 102. It can also have materials such as CNT. CNT provides an excellent thermal conductor so that a particularly good heat sink will have been formed via cathode layer 102.

Third Exemplary Embodiment

Figure 6:
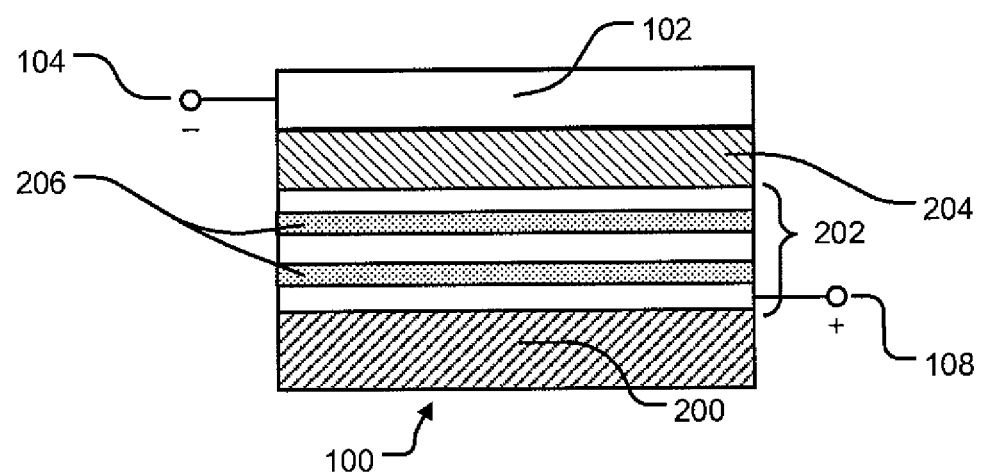
FIG. 6 shows a cross-section through a third exemplary embodiment along intersection axis A-A.

FIG. 6 shows a cross-section through a third exemplary embodiment along intersection axis A-A. The third exemplary embodiment differs from the first and second exemplary embodiment in that thermally-conducting layer 206 has been incorporated in anode layer 202 in the form of a plurality of partial regions. The partial regions of thermally-conducting layer 206 therein form intermediate layers incorporated through the anode-layer material in an alternating manner. The thickness of thermally-conducting layer 206 can therein be selected such as to affect the optical properties of anode layer 202 as little as possible. The use of CNTs is therein also particularly suitable because that material is a good electrical conductor when the structure of the nano tubes has been selected appropriately.

Fourth Exemplary Embodiment

Figure 7:
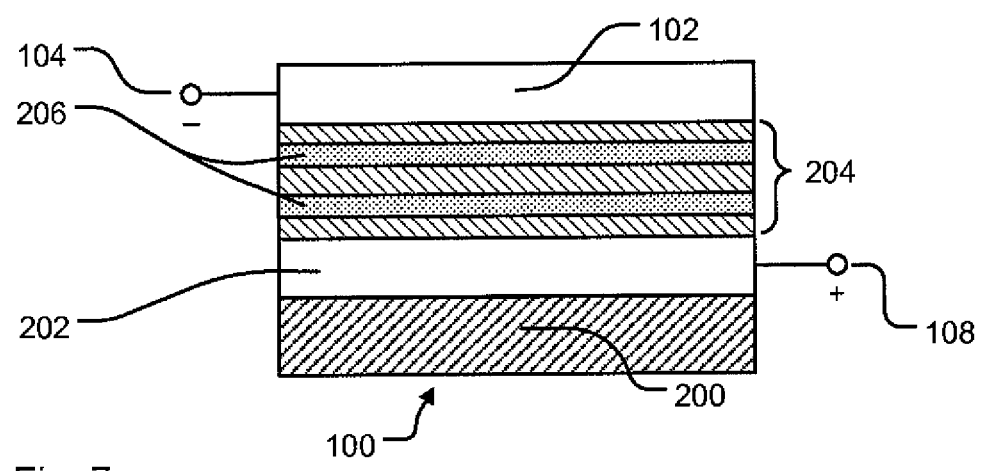
FIG. 7 shows a cross-section through a fourth exemplary embodiment along intersection axis A-A.

FIG. 7 shows a cross-section through a fourth exemplary embodiment along intersection axis A-A. The fourth exemplary embodiment differs from the other exemplary embodiments in that thermally-conducting layer 206 has been incorporated in organic functional layer 204 in the form of intermediate layers. The intermediate layers can mutually separate functional partial layers such as, for example, the HTL, the active layer, or the ETL, or be embedded in said functional partial layers. In particular a material such as CNT can be used here, too, owing to its optical and electrical properties.

All the cited exemplary embodiments can be appropriately mutually combined so that partial regions of thermally-conducting layer 206 can be provided at all suitable locations in organic light-emitting device 100. Said partial regions are each designed as a heat sink, for example by extending up to an outside region of organic light-emitting device 100, so that heat will be conveyed to the outside. They can, for example, also be thermally coupled to other heat sinks, for example to cooling bodies.

Overall, a graphite foil or CNTs are suitable as a material for thermally-conducting layer 206 because they can consequently be used at all appropriate locations in organic light-emitting device 100. As a material, CNTs exhibit particularly good thermal conductivity so that heat generated in device 100 can be effectively transported to the outside. The electrical properties of CNTs which enable them to be used as a semiconductor or electrical conductor moreover allow them to be used in a particularly versatile manner in the various materials of organic light-emitting device 100. Finally, CNTs' optical properties make them suitable for only slightly affecting the luminance characteristics of device 100. The CNTs are applied by means in particular of thermal vapor deposition to prevent unnecessarily thermally stressing of already incorporated organic materials.

Closing Statement

The organic light-emitting device has been described with the aid of a few exemplary embodiments for elucidating the underlying idea. The exemplary embodiments are not therein limited to specific feature combinations. Even when some features and embodiments were described only in connection with one particular exemplary embodiment or with individual exemplary embodiments, they can in each case be combined with other features from other exemplary embodiments. Individual features presented in exemplary embodiments can also be omitted or added as can particular embodiments, provided the general technical disclosure can still be realized.

The invention claimed is:

1. An organic light-emitting device comprising:
   an active layer for producing electroluminescent radiation and decoupling the electroluminescent radiation; and
   a thermally-conducting layer located in a decoupling path of the electroluminescent radiation for dissipating heat generated during an electroluminescence process, the thermally-conducting layer comprising a multiplicity of separate partial regions, and the thermally-conducting layer comprising carbon nano tubes as thermally-conducting material;
   wherein the thermally-conducting layer has a thermal conductivity of more than 200W/mK.

2. The organic light-emitting device of claim 1, wherein the thermally-conducting layer is in direct contact with the active layer.

3. The organic light-emitting device of claim 1, wherein the thermally-conducting layer is located in a radiation-decoupling path of the electroluminescent radiation.

4. The organic light-emitting device of claim 1, further comprising an anode layer, wherein the thermally-conducting layer is an intermediate layer in the anode layer.

5. The organic light-emitting device of claim 1, further comprising an anode layer, wherein the thermally-conducting layer comprises a multiplicity of intermediate layers in the anode layer.

6. The organic light-emitting device of claim 1, further comprising an organic functional layer comprising the active layer, wherein the thermally-conducting layer comprises an intermediate layer in the organic functional layer.

7. The organic light-emitting device of claim 6, wherein the thermally-conducting layer comprises a multiplicity of intermediate layers in the organic functional layer.

8. The organic light-emitting device of claim 1, further comprising a cathode layer, wherein the thermally-conducting layer covers the cathode layer.

9. The organic light-emitting device of claim 1, further comprising an anode layer and an organic functional layer, wherein the thermally-conducting layer is located between the anode layer and the organic functional layer.

10. The organic light-emitting device of claim 9, wherein the thermally-conducting layer extends in the form of separate strips on a boundary area between the anode layer and the organic functional layer.

11. The organic light-emitting device of claim 9, wherein the thermally-conducting layer extends like a network on the boundary area between the anode layer and the organic functional layer.

12. The organic light-emitting device of claim 1, wherein the thermally-conducting layer comprises a graphite foil as thermally-conducting material.

13. The organic light-emitting device of claim 1, wherein the thermally-conducting layer has a thermal conductivity of more than 500 W/mK.

* * * * *